United States Patent [19]

Narahara et al.

[11] Patent Number: 5,479,045

[45] Date of Patent: Dec. 26, 1995

[54] SEMICONDUCTOR CIRCUIT DEVICE CAPABLE OF REDUCING INFLUENCE OF A PARASITIC CAPACITOR

[75] Inventors: Tetsuya Narahara; Yasushi Matsubara, both of Tokyo, Japan

[73] Assignee: NEC Corporation, Tokyo, Japan

[21] Appl. No.: 451,169

[22] Filed: May 26, 1995

Related U.S. Application Data

[62] Division of Ser. No. 263,737, Jun. 22, 1994.

[30] Foreign Application Priority Data

Jun. 25, 1993  [JP]  Japan ................................. 5-154045
Jun. 25, 1993  [JP]  Japan ................................. 5-154056

[51] Int. Cl.$^6$ .......................... H01L 29/00; H01L 29/76
[52] U.S. Cl. ..................... 257/533; 257/296; 257/379; 257/532; 257/536; 327/54; 327/55; 327/65; 327/67; 327/81; 327/89; 327/280; 327/287
[58] Field of Search .................... 257/296, 379, 257/533, 532, 536; 327/54, 55, 65, 67, 81, 89, 280, 287

[56] References Cited

U.S. PATENT DOCUMENTS

| | | | |
|---|---|---|---|
| 4,636,738 | 1/1987 | Westwick et al. . | |
| 4,641,108 | 2/1987 | Gill, Jr. | 330/307 |
| 4,812,733 | 3/1989 | Tobey | 323/285 |
| 5,406,118 | 4/1995 | Saito | 257/664 |

FOREIGN PATENT DOCUMENTS

| | | |
|---|---|---|
| 101338A1 | 2/1984 | France . |
| 59-185432 | 2/1985 | Japan . |
| 2-246409 | 12/1990 | Japan . |
| 4-064997 | 2/1992 | Japan . |
| 5-145351 | 6/1993 | Japan . |

OTHER PUBLICATIONS

T. Wakimoto et al.; "A Low–Power Wide–Band Amplifier Using a New Parasitic Capacitance Compensation Technique"; IEEE Journal of Solid State Circuits, vol. 5, No. 1, Feb. 1990, pp. 200–206.

*Primary Examiner*—Ngân V. Ngô
*Attorney, Agent, or Firm*—Whitham, Curtis, Whitham & McGinn

[57] ABSTRACT

In a semiconductor circuit device comprising a differential amplifier circuit, which is formed on a semiconductor substrate and which comprises first and second input terminals, and a circuit element formed on the semiconductor substrate and connected to one of the first and the second input terminals. A dummy circuit element is formed on the semiconductor substrate so as to adjoin the circuit element for forming between the dummy circuit element and the semiconductor substrate a dummy parasitic capacitor which is equivalent to a parasitic capacitor formed between the circuit element and the semiconductor substrate. The dummy circuit element is connected to another one of the first and the second input terminals.

6 Claims, 10 Drawing Sheets

SEMICONDUCTOR CIRCUIT DEVICE CAPABLE OF REDUCING INFLUENCE OF A PARASITIC CAPACITOR

This is a Divisional Application of application Ser. No. 08/263,737 filed Jun. 22, 1994.

BACKGROUND OF THE INVENTION

This invention relates to a semiconductor circuit device which comprises a differential amplifier circuit.

A reference voltage generation circuit is well known in the art as an example of a semiconductor circuit device comprising a differential amplifier circuit. In the case that the reference voltage generation circuit is implemented by a semiconductor integrated circuit, the reference voltage generation circuit comprises a semiconductor substrate, first through third resistors which are formed on the semiconductor substrate, and the differential amplifier circuit which is formed on the semiconductor substrate. The differential amplifier circuit comprises first and second input terminals and an output terminal. The first resistor is connected between a signal input terminal and the first input terminal through a first wiring pattern. The first resistor and the first wiring pattern serve as a signal input line. A second resistor is connected between the output terminal and the second input terminal through a second wiring pattern. Furthermore, the second input terminal is grounded through the third resistor. The first input terminal is supplied with an input signal through the first resistor and has a first input electric potential or voltage. The second input terminal has a second input electric potential or voltage.

The reference voltage generation circuit amplifies a differential voltage between the first and the second input voltages and delivers an amplified signal to the output terminal as an output signal having a predetermined reference voltage. The second resistor serves as a feedback resistor to feedback the output signal to the second input terminal. Therefore, the second resistor and the second wiring pattern serve as a feedback line. The third resistor serves as a voltage dividing resistor.

In the meantime, the reference voltage generation circuit is inevitable to have first and second parasitic capacitors. The first parasitic capacitor is formed between the signal input line and the semiconductor substrate, in particular, between the first resistor and the semiconductor substrate. The first parasitic capacitor has a first capacitance value. Similarly, the second parasitic capacitor is formed between the feedback line and the semiconductor substrate, in particular, between the second resistor and the semiconductor substrate. The second parasitic capacitor has a second capacitance value. The first and the second capacitance values are different from one another. The first and the second input voltages are influenced by the first and the second parasitic resistors, respectively. If an outer noise intrudes into the reference voltage generation circuit, the first and the second input voltages individually vary in amplitude with a time lag because the first and the second capacitance values are different from one another. In this event, the output signal has a large variation of amplitude. This means that the reference voltage generation circuit is hard to generate the output signal having the predetermined reference voltage.

SUMMARY OF THE INVENTION

It is therefore an object of this invention to provide a semiconductor circuit device which is capable of reducing influence of parasitic capacitors.

Other objects of this invention will become clear as the description proceeds.

On describing the gist of a first aspect of this invention, it is possible to understand that a semiconductor circuit device comprises a semiconductor substrate and a differential amplifier circuit which is formed on the semiconductor substrate and which comprises first and second input terminals and an output terminal. The differential amplifier circuit is supplied with an input signal through a first resistor connected to the first input terminal and producing an output signal through the output terminal. The differential amplifier circuit is supplied with the output signal through a second resistor connected between the second input terminal and the output terminal. The semiconductor circuit device has a first parasitic capacitor formed between the semiconductor substrate and the first resistor and a second parasitic capacitor formed between the semiconductor substrate and the second resistor.

According to the first aspect of this invention, each of the first and the second resistors is implemented by a wiring pattern and is formed in a wiring layer formed on the semiconductor substrate so that the first and the second parasitic capacitors are equivalent to each other.

On describing the gist of a second aspect of this invention, it is possible to understand that a semiconductor circuit device comprises a semiconductor substrate, a differential amplifier circuit which is formed on the semiconductor substrate and which comprises first and second input terminals, and a circuit element formed on the semiconductor substrate and connected to one of the first and the second input terminals. The semiconductor circuit device has a first parasitic capacitor formed between the circuit element and the semiconductor substrate.

According to the second aspect of this invention, the semiconductor circuit device further comprises a dummy circuit element formed on the semiconductor substrate so as to adjoin the circuit element for forming between the dummy circuit element and the semiconductor substrate a second parasitic capacitor which is equivalent to the first parasitic capacitor. The dummy circuit element is connected to another one of the first and the second input terminals.

DESCRIPTION OF THE PREFERRED EMBODIMENTS

Figure 1:
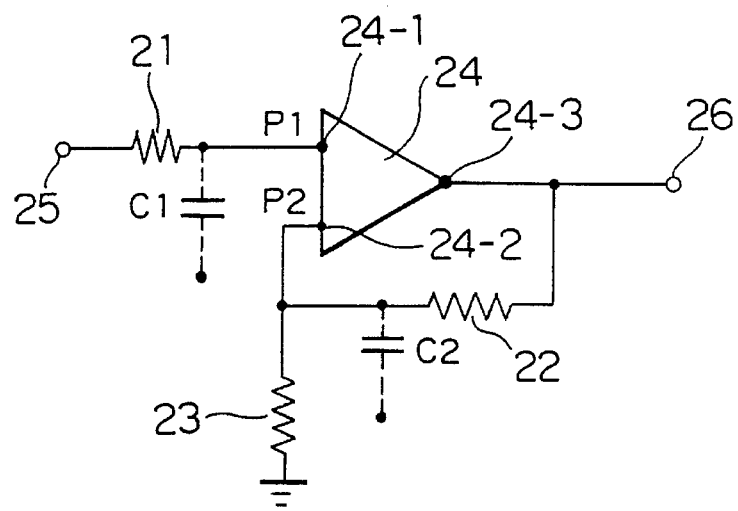
FIG. 1 shows a circuit arrangement of a conventional reference voltage generation circuit.
Figure 2:
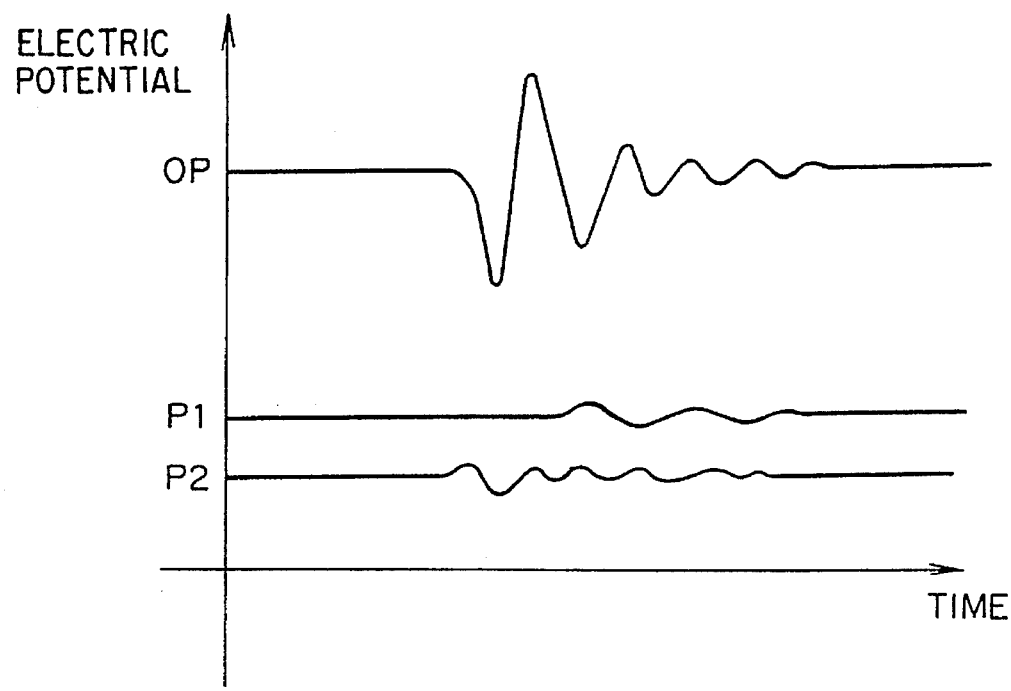
FIG. 2 shows waveforms for describing operation of the reference voltage generation circuit illustrated in FIG. 1.

Referring to FIGS. 1 and 2, a reference voltage generation circuit, as a first example of a conventional semiconductor circuit device, will be described at first in order to facilitate an understanding of this invention. The reference voltage generation circuit comprises first through third resistors 21 to 23 and a differential amplifier circuit 24 having first and second input terminals 24-1 and 24-2 and an output terminal 24-3. The first input terminal 24-1 is connected to a signal input terminal 25 through the first resistor 21 and is supplied with an input signal having a constant electric potential or voltage. The second input terminal 24-2 is connected to the output terminal 24-3 through the second resistor 22 and is grounded through the third resistor 23. As will become clear, the second resistor 22 serves as a feedback resistor to feedback an output signal delivered from the differential amplifier circuit 24 to the second input terminal 24-2. The third resistor 23 serves as a voltage dividing resistor. The differential amplifier circuit 24 may be called a comparator circuit.

In the case that the reference voltage generating circuit is implemented by a semiconductor integrated circuit device, the differential amplifier circuit 24 is formed on a semiconductor substrate (not shown). The first resistor 21 is connected between the signal input terminal 25 and the first input terminal 24-1 through a first wiring pattern. The first resistor 21 and the first wiring pattern are collectively called a signal input line. The first wiring pattern is formed in an upper wiring layer formed on the semiconductor substrate. The second resistor 22 is connected between the output terminal 24-3 and the second input terminal 24-2 through a second wiring pattern. The second resistor 22 and the second wiring pattern are collectively called a feedback line. The second wiring pattern is formed in a middle wiring layer formed between the upper wiring layer and the semiconductor substrate. The output terminal 24-3 and the signal output terminal 26 are connected through a third wiring pattern which is called a signal output line. The third resistor 23 is grounded through a ground line. The ground line is implemented by a ground wiring pattern.

When the input signal is supplied to the first input terminal 24-1 through the signal input terminal 25, the first input terminal 24-1 has a first electric potential P1. The output signal is turned back to the second input terminal 24-2 through the feedback line. In this state, the second input terminal 24-2 has a second electric potential P2 which is determined by values of the first and the second resistors 22 and 23. If an output electric potential OP of the output signal increases, the second electric potential P2 becomes higher than the first electric potential P1. In this case, the differential amplifier circuit 24 acts so as to decrease a differential electric potential between the first and the second electric potentials. As a result, the output electric potential OP of the output signal is reduced so that the first and the second electric potentials P1 and P2 are equal to each other.

When the output electric potential OP decreases, the second electric potential P2 becomes lower than the first electric potential P1. In this event, the differential amplifier circuit 24 acts so as to decrease the differential electric potential between the first and the second electric potentials P1 and P2. As a result, the output electric potential OP of the output signal is increased so that the first and the second electric potentials P1 and P2 are equal to each other. By a feedback operation through the feedback line, the differential amplifier circuit 24 delivers, through the signal output terminal 26, the output signal having a constant output electric potential.

The above-mentioned operation is an ideal operation in an ideal state. Practically, the reference voltage generation circuit has first and second parasitic capacitors which are symbolically depicted at C1 and C2. The first parasitic capacitor C1 has a first capacitance value. The first parasitic capacitor C1 is formed between the first resistor 21 and the semiconductor substrate and between the first wiring pattern and the other wiring patterns which are formed on the semiconductor substrate. Likewise, the second parasitic capacitor C2 has a second capacitance value. The second parasitic capacitor C2 is formed between the second resistor 22 and the semiconductor substrate and between the second wiring pattern and the other wiring patterns which are formed on the semiconductor substrate.

In general, the first and the second capacitance values are greatly different from one another. This is because the first wiring pattern and the second wiring pattern are formed in the upper and the middle wiring layers which are different, in location and in forming condition, from one another. This means that the first and the second electric potentials P1 and P2 are individually influenced by the first and the second parasitic capacitors, respectively. If an outer noise intrudes into the reference voltage generation circuit, the first and the second electric potentials P1 and P2 individually vary in amplitude with a time lag. As a result, the output electric potential OP extremely varies in amplitude as shown in FIG. 2.

Figure 3:
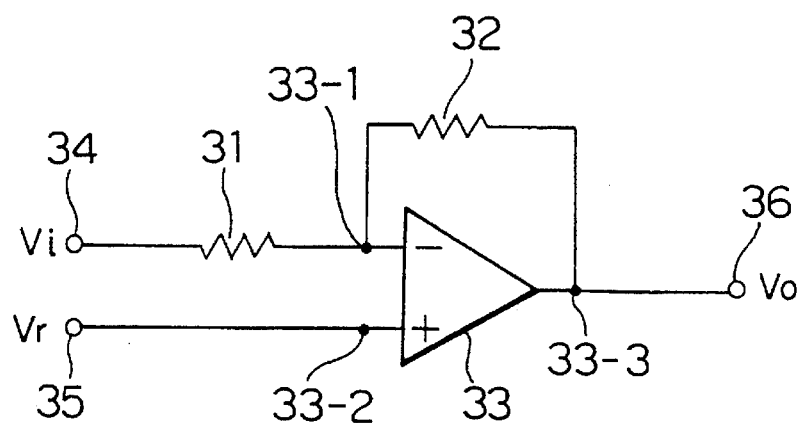
FIG. 3 shows a circuit arrangement of a conventional inverting amplifier circuit.

Referring to FIG. 3, an inverting amplifier circuit, as a second example of the conventional semiconductor circuit device, will be described. The inverting amplifier circuit comprises a first resistor 31 having a first resistance value R1, a second resistor 32 having a second resistance value R2, and a differential amplifier circuit 33 which comprises an inverting terminal 33-1, a non-inverting terminal 33-2, and an output terminal 33-3. The inverting terminal 33-1 is connected to a signal input terminal 34 through the first resistor 31 while the non-inverting terminal 33-2 is directly connected to a reference voltage input terminal 35. The second resistor 32 serves as the feedback resistor and is connected between the inverting terminal 33-1 and the output terminal 33-3.

The signal input terminal 34 is supplied with an input signal having an input voltage Vi while the reference voltage input terminal 35 is supplied with a reference voltage Vr. The inverting amplifier amplifies a difference voltage between the input voltage Vi and the reference voltage Vr and delivers an amplified signal having an output voltage Vo to a signal output terminal 36 as an output signal. The output voltage Vo is given by:

$$Vo=(-R2/R1)(Vi-Vr)+Vr.$$

Figure 4:
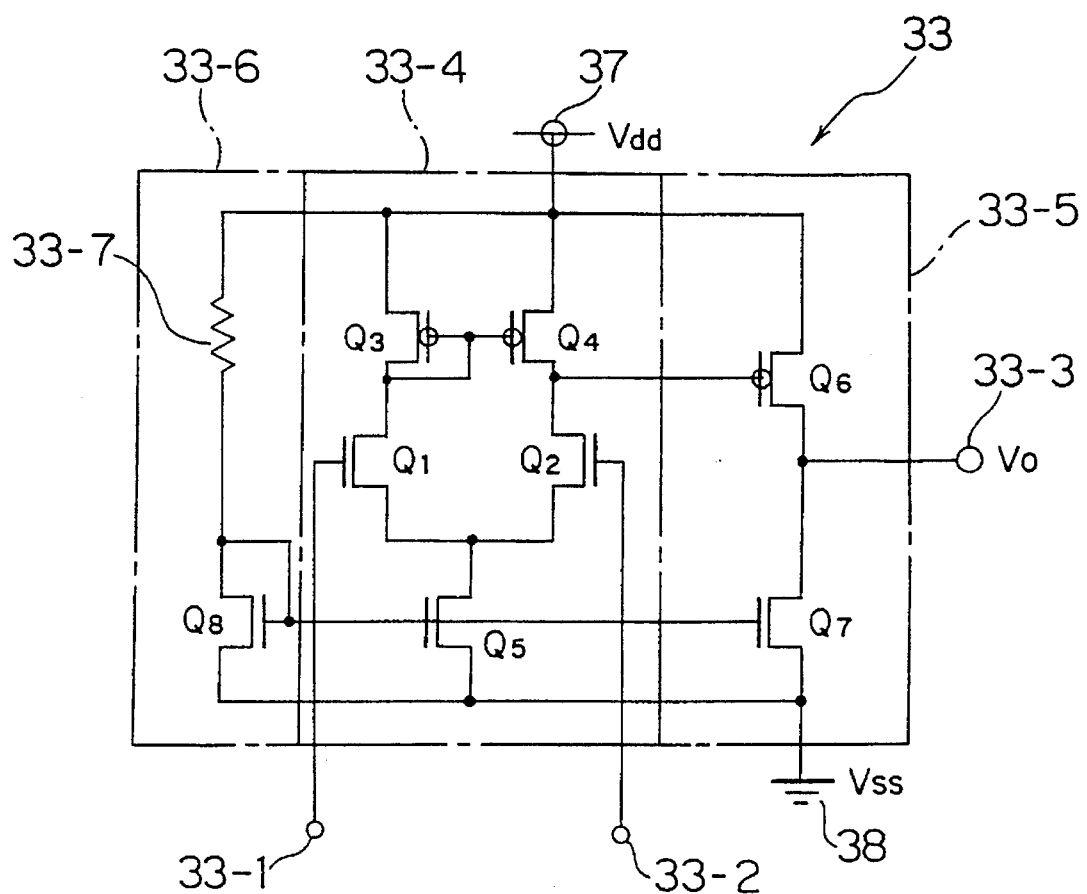
FIG. 4 shows a circuit arrangement of a differential amplifier circuit illustrated in FIG. 3.

Referring to FIG. 4, the differential amplifier circuit 33 comprises a differential amplifier section 33-4, an output amplifier section 33-5, and a bias generating section 33-6. The differential amplifier section 33-4 comprises first and second MOS transistors Q1 and Q2 of an n-channel type and third and fourth MOS transistors Q3 and Q4 of a p-channel type, which are connected in current mirror connection. The first and the second MOS transistors Q1 and Q2 have gate electrodes connected to the inverting and the non-inverting input terminals 33-1 and 33-2, respectively. The third and the fourth MOS transistors Q3 and Q4 serve as active loads for the first and the second MOS transistors Q1 and Q2, respectively. The differential amplifier section 33-4 further comprises a fifth MOS transistor Q5 of the n-channel type for supplying a constant current to the first and the second MOS transistors Q1 and Q2. The fifth MOS transistor Q5 serves as a current source for the differential amplifier section 33-4.

The output amplifier section 33-5 comprises sixth and seventh MOS transistors Q6 and Q7 which are connected in series. The sixth and the seventh MOS transistors Q6 and Q7 are the p-channel and the n-channel types, respectively. The seventh MOS transistor Q7 serves as a current source for the output amplifier section 33-5. The bias generating section 33-6 is connected between a high voltage power supply line 37 and a low voltage power supply line 38. The high voltage power supply line 37 has a first voltage Vdd while the low voltage power supply line 38 has a second voltage Vss which is lower than the first voltage Vdd. The bias generating section 33-6 comprises a resistor 33-7 and an eighth MOS transistor Q8 of the n-channel type, which are connected in series. The bias generating section 33-6 is for generating a gate bias voltage to supply the gate bias voltage to gate electrodes of the fifth and the seventh MOS transistors Q5 and Q7.

An inverting output signal of the differential amplifier section 33-4 appears at a connection point CP1 between a drain electrode of the second MOS transistor Q2 and a drain electrode of the fourth MOS transistor Q4. The inverting output signal is amplified by the output amplifier section 33-5 and is delivered from the output terminal 33-3.

The inverting amplifier circuit can be implemented by a semiconductor integrated circuit of a single chip. In this case, the first and the second resistors 31 and 32 can be formed in first and second manners. In the first manner, each of the first and the second resistors 31 and 32 can be implemented by a diffusion layer formed in a semiconductor substrate. For example, in a silicon semiconductor integrated circuit, the first and the second resistors 31 and 32 can be implemented by an $n^+$ diffusion layer formed on a silicon crystal substrate of a p-type as will shortly be described. In the second manner, each of the first and the second resistors 31 and 32 can be implemented by a conductive layer having a high sheet resistance value. The conductive layer is formed on an insulator layer which is called a field area. In the silicon semiconductor integrated circuit, the first and the second resistors 31 and 32 can be implemented by a polycrystal silicon film formed on a field oxide film ($SiO_2$) as will later be described.

Figure 5:
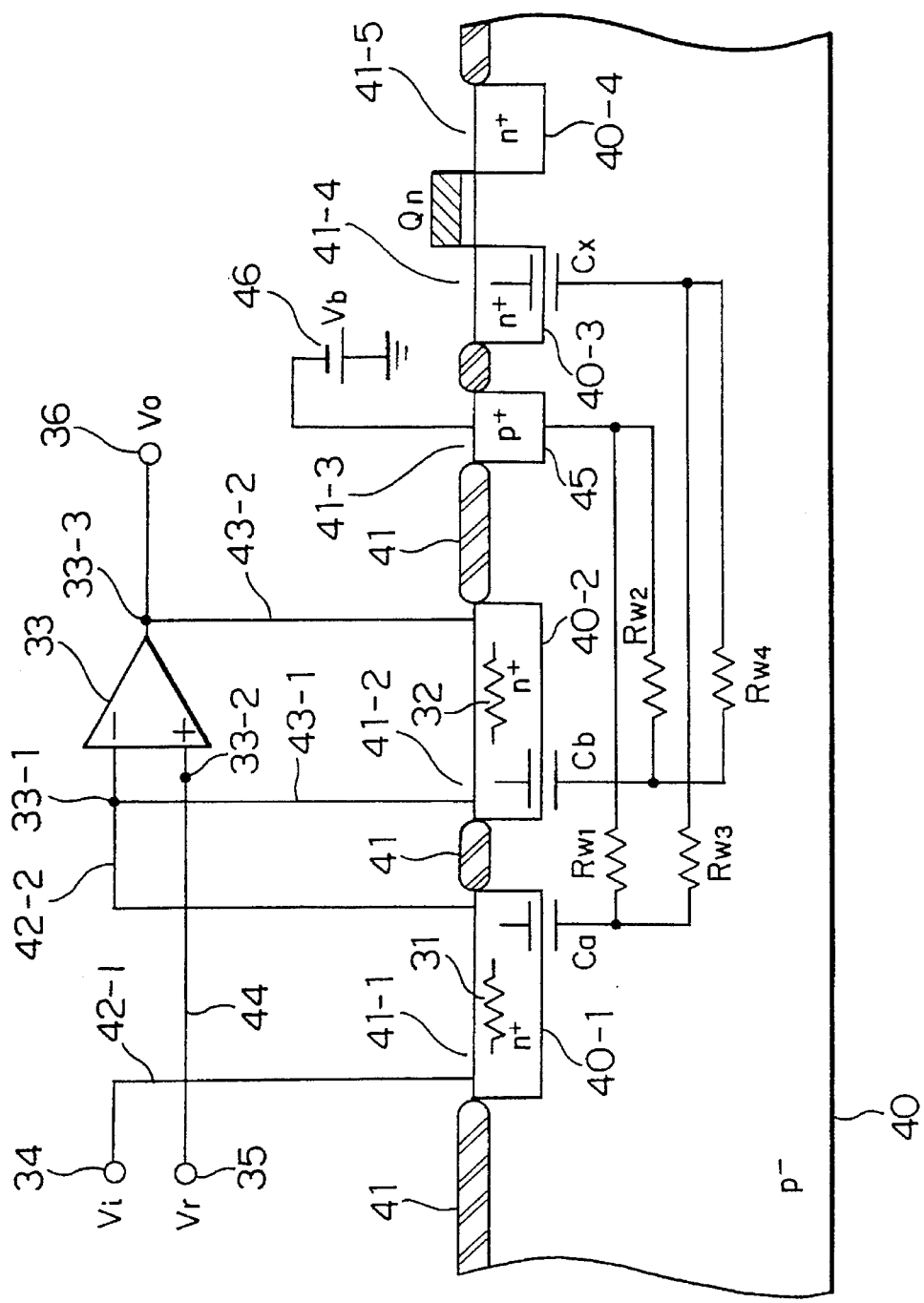
FIG. 5 shows a sectional view of a semiconductor substrate for describing a first manner which is for forming first and second resistors illustrated in FIG. 3.

Referring to FIG. 5, the description will be made as regards the first manner. A field oxide film 41 is formed on a silicon substrate 40 of a p-type and has first and second apertures 41-1 and 41-2. The silicon substrate 40 serves as the semiconductor substrate. Under the first and the second apertures 41-1 and 41-2, first and second $n^+$ diffusion layers 40-1 and 40-2 are formed on the silicon substrate 40. The first and the second $n^+$ diffusion layers 40-1 and 40-2 serve as the first and the second resistors 31 and 32, respectively. The first $n^+$ diffusion layer 40-1 is connected between the signal input terminal 34 and the inverting terminal 33-1 through aluminum wiring patterns 42-1 and 42-2. The aluminum wiring patterns 42-1 and 42-2 may collectively be called the first wiring pattern. The second $n^+$ diffusion layer 40-2 is connected between the inverting terminal 33-1 and the output terminal 33-3 through aluminum wiring patterns 43-1 and 43-2. The aluminum wiring patterns 43-1 and 43-2 may collectively be called the second wiring pattern. The reference voltage input terminal 35 is connected to the non-inverting terminal 33-2 through an aluminum wiring pattern 44. Although the differential amplifier circuit 33 and the aluminum wiring patterns 42-1, 42-2, 43-1, 43-2, and 44 are illustrated outside the silicon substrate 40 for convenience of illustration, these are formed on the silicon substrate 40 in practice. This applies to the signal input terminal 34, the reference voltage input terminal 35, and the signal output terminal 36.

A $p^+$ diffusion layer 45 is formed on the silicon substrate 40 through a third aperture 41-3. The $p^+$ diffusion layer 45 is connected to a power source 46 and is for supplying a substrate bias voltage Vb to the silicon substrate 40 as known in the art. For a better understanding of the following description, it will be assumed that an MOS transistor Qn is formed on the silicon substrate 40. The MOS transistor Qn is an n-channel type and is used for another circuit (not shown) formed on the silicon substrate 40. Third and fourth $n^+$ diffusion layers 40-3 and 40-4 are formed on the silicon substrate 40 through fourth and fifth apertures 41-4 and 41-5 and serve as drain and source electrodes, respectively.

In such an inverting amplifier circuit which is implemented by the integrated circuit of a single chip, an S/N (signal-to-noise ratio) is apt to reduce by the outer noise which changes a potential of the silicon substrate 40. This is based on the following reason.

The inverting amplifier circuit has parasitic capacitors between the silicon substrate 40 and every one of the first and the second n diffusion layers 40-1 and 40-2, the $p^+$ diffusion layer 45, and the third and the fourth $n^+$ diffusion layers 40-3 and 40-4. In the example being illustrated, first through third parasitic capacitors are symbolically depicted at Ca, Cb, and Cx, respectively, for convenience of description. The first parasitic capacitor Ca is formed between the silicon substrate 40 and the first n⁺ diffusion layer 40-1 while the second parasitic capacitor Cb is formed between the silicon substrate 40 and the second n⁺ diffusion layer 40-2. The third parasitic capacitor Cx is formed between the silicon substrate 40 and the third n⁺ diffusion layer 40-3. The first through the third parasitic capacitors Ca, Cb, and Cx are different from each other in capacitance value.

In addition to the parasitic capacitors mentioned above, the inverting amplifier circuit has parasitic resistors because the silicon substrate 40 has a resistance component. In the example, first through fourth parasitic resistors are symbolically depicted at Rw1, Rw2, Rw3, and Rw4. The first n⁺ diffusion layer 40-1 and the p⁺ diffusion layer 45 are connected through the first parasitic resistor Rw1 and the first parasitic capacitor Ca while the second n⁺ diffusion layer 40-2 and the p⁺ diffusion layer 45 are connected through a second parasitic resistor Rw2 and the second parasitic capacitor Cb. The first n⁺ diffusion layer 40-1 and the third n⁺ diffusion layer 40-3 are connected through a third parasitic resistor Rw3 and the first parasitic capacitor Ca while the second n⁺ diffusion layer 40-2 and the third n⁺ diffusion layer 40-3 are connected through the fourth parasitic resistor Rw4 and the second parasitic capacitor Cb.

If the outer noise intrudes into the p⁺ diffusion layer 45, it causes variation of the potential of the silicon substrate 40. Such variation of the potential is transmitted to the first n⁺ diffusion layer 40-1 through the first parasitic resistor Rw1 and the first parasitic capacitor Ca and is transmitted to the second n⁺ diffusion layer 40-2 through the second parasitic resistor Rw2 and the second parasitic capacitor Cb. In this event, it causes variation of the potentials of the first and the second n⁺ diffusion layers 40-1 and 40-2, namely, the first and the second resistors 31 and 32.

On the other hand, if the potential of the third n⁺ diffusion layer 40-3, namely, the drain electrode, varies with the operation of the MOS transistor Qn, the variation is transmitted to the silicon substrate 40 through the third parasitic capacitor Cx. In this event, it causes the variation of the potential of the silicon substrate 40. The variation of the potential is transmitted to the first n⁺ diffusion layer 40-1 through the third parasitic resistor Rw3 and the first parasitic capacitor Ca and is transmitted to the second n⁺ diffusion layer 40-2 through the fourth parasitic resistor Rw4 and the second parasitic capacitor Cb. It causes the variation of the potentials of the first and the second resistors 31 and 32.

Inasmuch as the variation of the potentials of the first and the second resistors 31 and 32 are amplified by the differential amplifier circuit 33 together with the input signal supplied from the signal input terminal 34, the inverting amplifier circuit has a degraded S/N. Let the first and the second resistors 31 and 32 has the first and the second resistance values R1 and R2 which are equal to 1 (kΩ) and 100 (kΩ), respectively. The reference voltage Vr and the input voltage Vi are equal to 0 (V) and 10 (mV), respectively. In this event, the output voltage Vo becomes equal to −1 (mV) without intrusion of the outer noise. On the other hand, if the outer noise of 1 (mV) is added to the inverting terminal 33-1 because of the first and the second parasitic capacitors Ca and Cb, the noise of 100 (mV) is included in the output voltage Vo.

Figure 6:
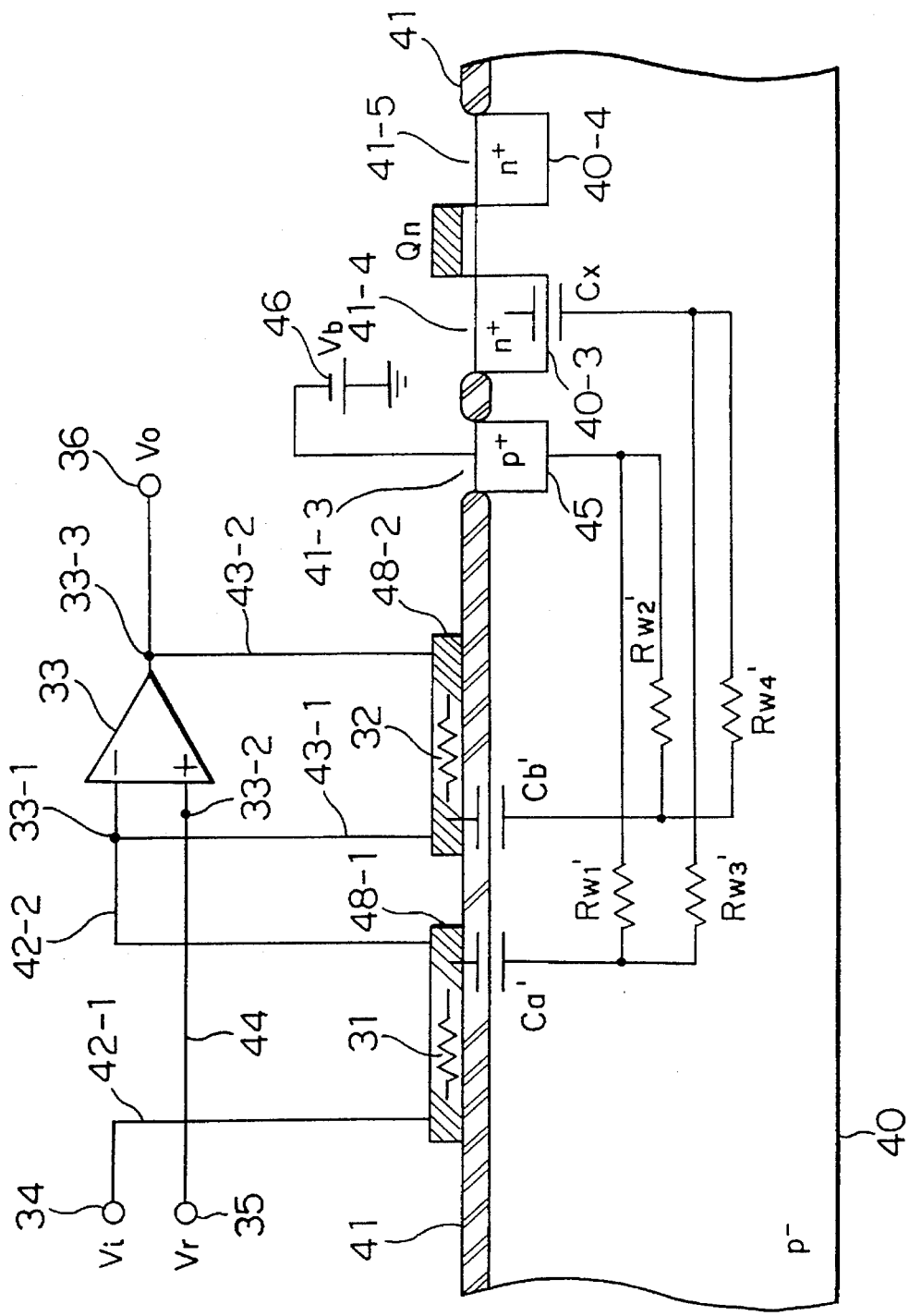
FIG. 6 shows a sectional view of the semiconductor substrate for describing a second manner which is for forming the first and the second resistors illustrated in FIG. 3.

Referring to FIG. 6, the description will be made as regards the second manner. An inverting amplifier circuit comprises similar parts designated by like reference numerals except that the first and the second resistors 31 and 32 are implemented by first and second polycrystal silicon patterns 48-1 and 48-2, respectively, formed on the field oxide film 41.

For the same reason mentioned in conjunction with FIG. 5, the inverting amplifier circuit has first through third parasitic capacitors which are caused by the field oxide film 41 and which are symbolically depicted at Ca', Cb', and Cx'. The first parasitic capacitor Ca' is formed between the silicon substrate 40 and the first polycrystal silicon pattern 48-1 while the second parasitic capacitor Cb' is formed between the silicon substrate 40 and the second polycrystal silicon pattern 48-2. The third parasitic capacitor Cx' is formed between the silicon substrate 40 and the third n⁺ diffusion layer 40-3.

In general, the field oxide film 41 has a thickness thicker than that of another film, such as a gate oxide film in the MOS transistor, in order to reduce a capacitance value of the parasitic capacitor in the wiring patterns to be formed on the field oxide film 41. This means that the capacitance value per a unit area is small. However, the polycrystal silicon pattern has a small sheet resistance value. In order to use the polycrystal silicon pattern as the resistor, it is required to have a large area. This means that the inverting amplifier circuit has the first through the third parasitic capacitors Ca', Cb', and Cx' which can not be disregarded in capacitance value.

In addition to the first through the third parasitic capacitors Ca', Cb', and Cx', the inverting amplifier circuit has first through third parasitic resistors Rw1', Rw2', Rw3', and Rw4'. The first polycrystal silicon pattern 48-1 and the p⁺ diffusion layer 45 are connected through the first parasitic resistor Rw1' and the first parasitic capacitor Ca' while the second polycrystal silicon pattern 48-2 and the p⁺ diffusion layer 45 are connected through a second parasitic resistor Rw2' and the second parasitic capacitor Cb'. The first polycrystal silicon pattern 48-1 and the third n⁺ diffusion layer 40-3 are connected through a third parasitic resistor Rw3' and the first parasitic capacitor Ca' while the second polycrystal silicon pattern 48-2 and the third n⁺ diffusion layer 40-3 are connected through the fourth parasitic resistor Rw4' and the second parasitic capacitor Cb'.

If the outer noise intrudes into the p⁺ diffusion layer 45, it causes the variation of the potentials of the first and the second resistors 31 and 32 for the same reason mentioned in conjunction with FIG. 5. On the other hand, if the potential of the third n⁺ diffusion layer 40-3 varies with the operation of the MOS transistor Qn, it causes the variation of the potentials of the first and the second resistors 31 and 32. In this case, the inverting amplifier circuit has the degraded S/N as mentioned in conjunction with FIG. 5.

Figure 7:
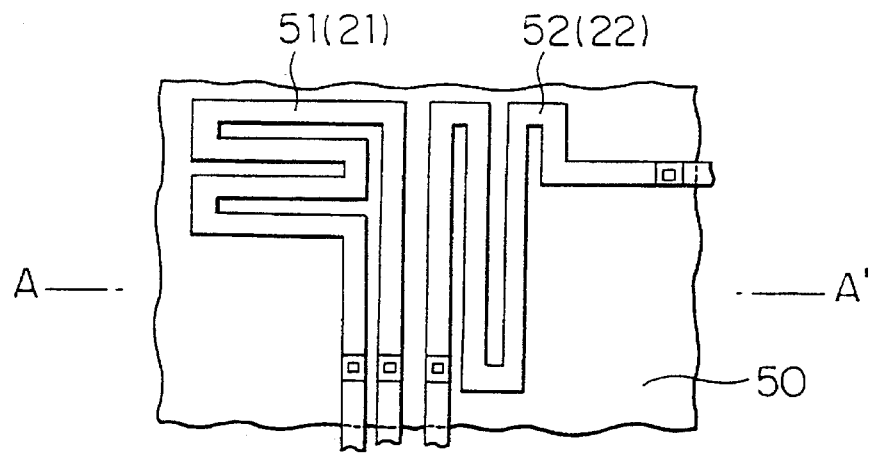
FIG. 7 shows a planar view for describing a manner which is for forming first and second resistors included in a reference voltage generation circuit according to a first embodiment of this invention.
Figure 8:
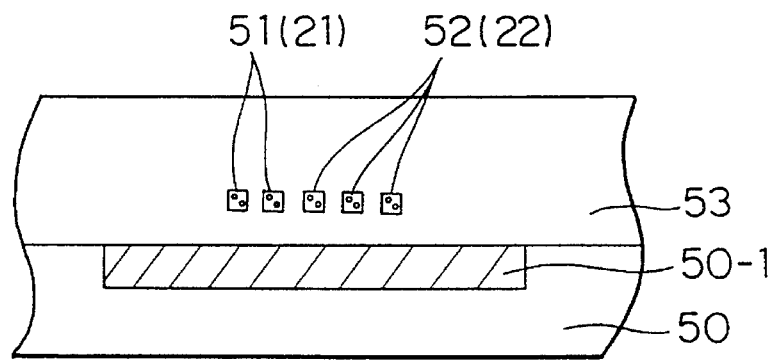
FIG. 8 shows a sectional view taken along lines A—A' of FIG. 7.
Figure 9:
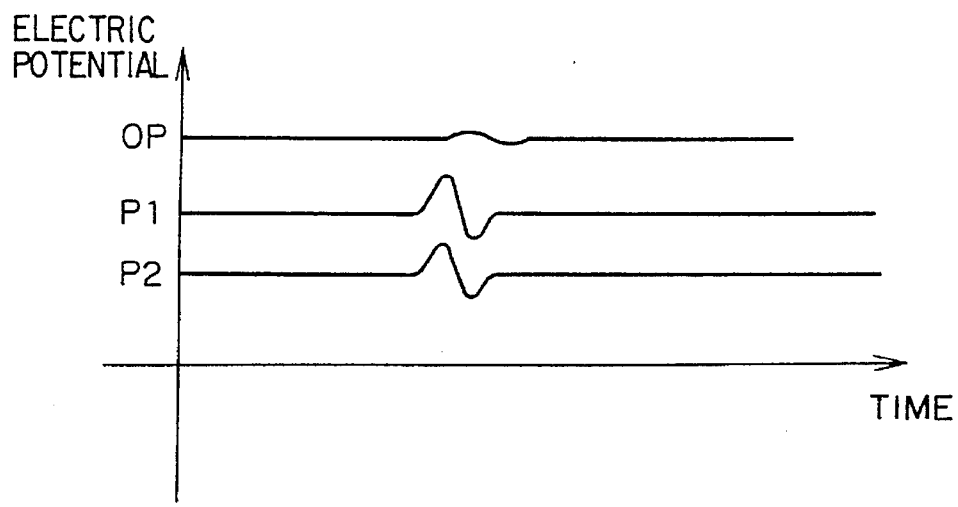
FIG. 9 shows waveforms for describing operation of the reference voltage generation circuit according to this invention.

Referring to FIGS. 7 to 9, the description will proceed to a reference voltage generation circuit, as an example of a semiconductor circuit device, according to a first embodiment of this invention. The reference voltage generation circuit comprises similar parts illustrated in FIG. 1. The reference voltage generation circuit is characterized in the manner how the first and the second resistors 21 and 22 are formed.

In FIGS. 7 and 8, although the reference voltage generation circuit is formed on a semiconductor substrate 50, the third resistor 23 (FIG. 1) and the differential amplifier circuit 24 (FIG. 1) are not illustrated for convenience. The first and the second resistors 21 and 22 are implemented by first and second wiring patterns 51 and 52 formed in a wiring layer 53. The wiring layer 53 is made from an insulating material and is formed on the semiconductor substrate 50. The reference voltage generation circuit has a first parasitic capacitor between the first wiring pattern 51 and the semiconductor substrate 50 and has a second parasitic capacitor between the second wiring pattern 52 and the semiconductor substrate 50. It should be noted here that the first and the second wiring patterns 51 and 52 are formed so that the first and the second parasitic capacitors are equivalent to each other in capacitance value.

The semiconductor substrate 50 comprises a diffusion layer 50-1 formed at an upper side thereof and at an all area which corresponds to a forming area of the first and the second wiring patterns 51 and 52. The diffusion layer 50-1 is for shielding electric field caused by the semiconductor substrate 50 and is implemented by an $n^+$ diffusion layer or a $p^+$ diffusion layer.

Inasmuch as the first and the second parasitic capacitors are equivalent to each other, the first and the second parasitic capacitors give the same influence to the first and the second electric potentials P1 and P2 (FIG. 1). In this case, the first and the second potentials P1 and P2 have the same variation in amplitude and in timing, even if the outer noise intrudes into the reference voltage generation circuit. As a result, the reference voltage generation circuit can produce the output signal without the variation of the output electric potential OP as illustrated in FIG. 9. In addition, the diffusion layer 50-1 may be removed.

Figure 10:
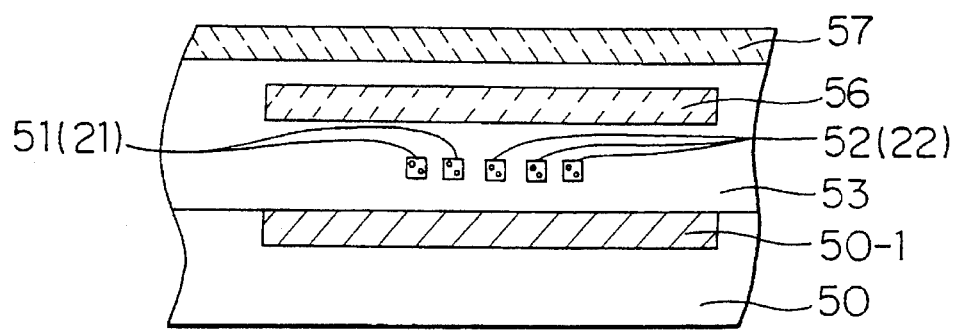
FIG. 10 shows a sectional view for describing another example of the reference voltage generation circuit according to this invention.

Referring to FIG. 10, the description will proceed to a reference voltage generation circuit according to a second embodiment of this invention. The reference voltage generation circuit comprises similar parts designated by like reference numerals except for a conductive film 56 and a third wiring pattern 57. Like in FIG. 8, although the reference voltage generation circuit is formed on the semiconductor substrate 50, the third resistor 23 (FIG. 1) and the differential amplifier circuit 24 (FIG. 1) are not illustrated.

The conductive film 56 is made from metal material, such as aluminum, and is formed in the wiring layer 53 so as to cover the first and the second wiring patterns 51 and 52. The third wiring pattern 53 is used for another circuit formed on the semiconductor substrate 50 and is formed on the wiring layer 57. The conductive film 56 serves as a shield layer for shielding the electric field caused by the third wiring pattern 57. Thus, the first and the second wiring patterns 51 and 52 are shielded by the diffusion layer 50-1 and the conductive film 56 from the electric field caused by the semiconductor substrate 50 and the third wiring pattern 57. This means that the reference voltage generation circuit is more stable in operation than that illustrated in FIG. 8.

Figure 11:
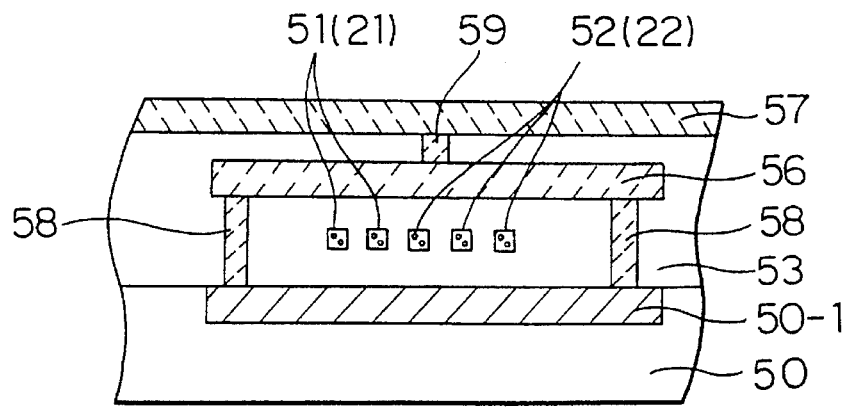
FIG. 11 shows a sectional view for describing still another example of the reference voltage generation circuit according to this invention.

Referring to FIG. 11, the description will be made as regards a reference voltage generation circuit according to a third embodiment of this invention. The reference voltage generation circuit comprises similar parts designated by like reference numerals except that the diffusion layer 50-1 and the conductive film 56 are connected by at least two through holes 58 and that the conductive film 56 and the third wiring pattern 57 are connected by at least one through hole 59. This means that the diffusion layer 50-1, the conductive film 56, and the third wiring pattern 57 are kept at the same electric potential. It is desirable that the same electric potential is equal to a ground potential. Thus, it is possible to increase a shield effect relative to that of the reference voltage generating circuits illustrated in FIGS. 8 and 10. In addition, the third resistor 23 (FIG. 1) and the differential amplifier circuit 24 (FIG. 1) are not illustrated for convenience.

Figure 12:
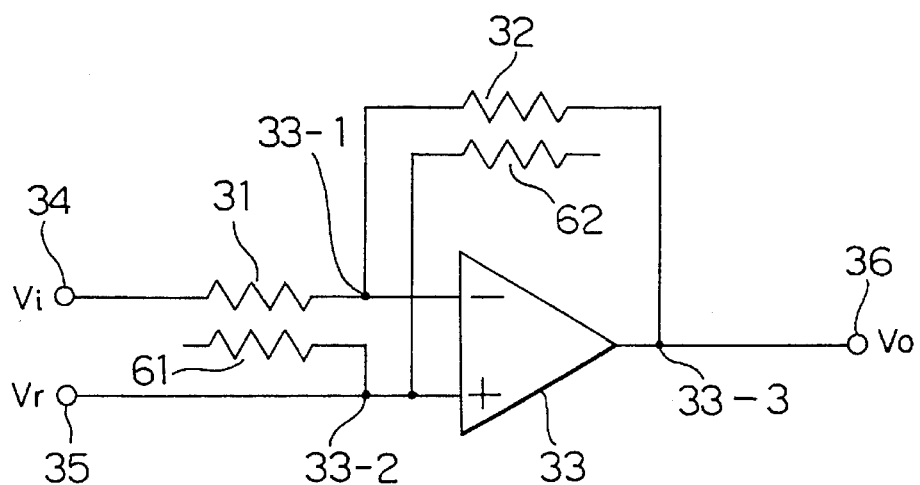
FIG. 12 shows a circuit arrangement of an inverting amplifier circuit, as an example of a semiconductor circuit device, according to this invention.

Referring to FIG. 12, the description will proceed to an inverting amplifier circuit according to a fourth embodiment of this invention. The inverting amplifier circuit is similar to that illustrated in FIG. 3 except that first and second dummy resistors 61 and 62 are formed on the semiconductor substrate (not shown) so as to adjoin the first and the second resistors 31 and 32, respectively.

As described in conjunction with FIGS. 3 to 5, the inverting amplifier circuit has the first parasitic capacitors Ca formed between the first resistor 31 and the semiconductor substrate 40 and the second parasitic capacitor Cb formed between the second resistor 32 and the semiconductor substrate 40. As will become clear, the first dummy resistor 61 has the same form as the first resistor 31 in planar form and sectional form. Likewise, the second dummy resistor 62 has the same form as the second resistor 32 in planar form and sectional form. As a result, a first dummy parasitic capacitor is formed between the first dummy resistor 61 and the semiconductor substrate while a second dummy parasitic capacitor is formed between the second dummy resistor 62 and the semiconductor substrate.

In the case that the first resistor 31 is connected to the inverting terminal 33-1, one end of the first dummy resistor 61 is connected to the non-inverting terminal 33-2. Another end of the first dummy resistor 61 is opened. Similarly, one end of the second dummy resistor 62 is connected to the non-inverting terminal 33-2 because the second resistor 32 is connected to the inverting terminal 33-1. Another end of the second dummy resistor 62 is opened.

Figure 13:
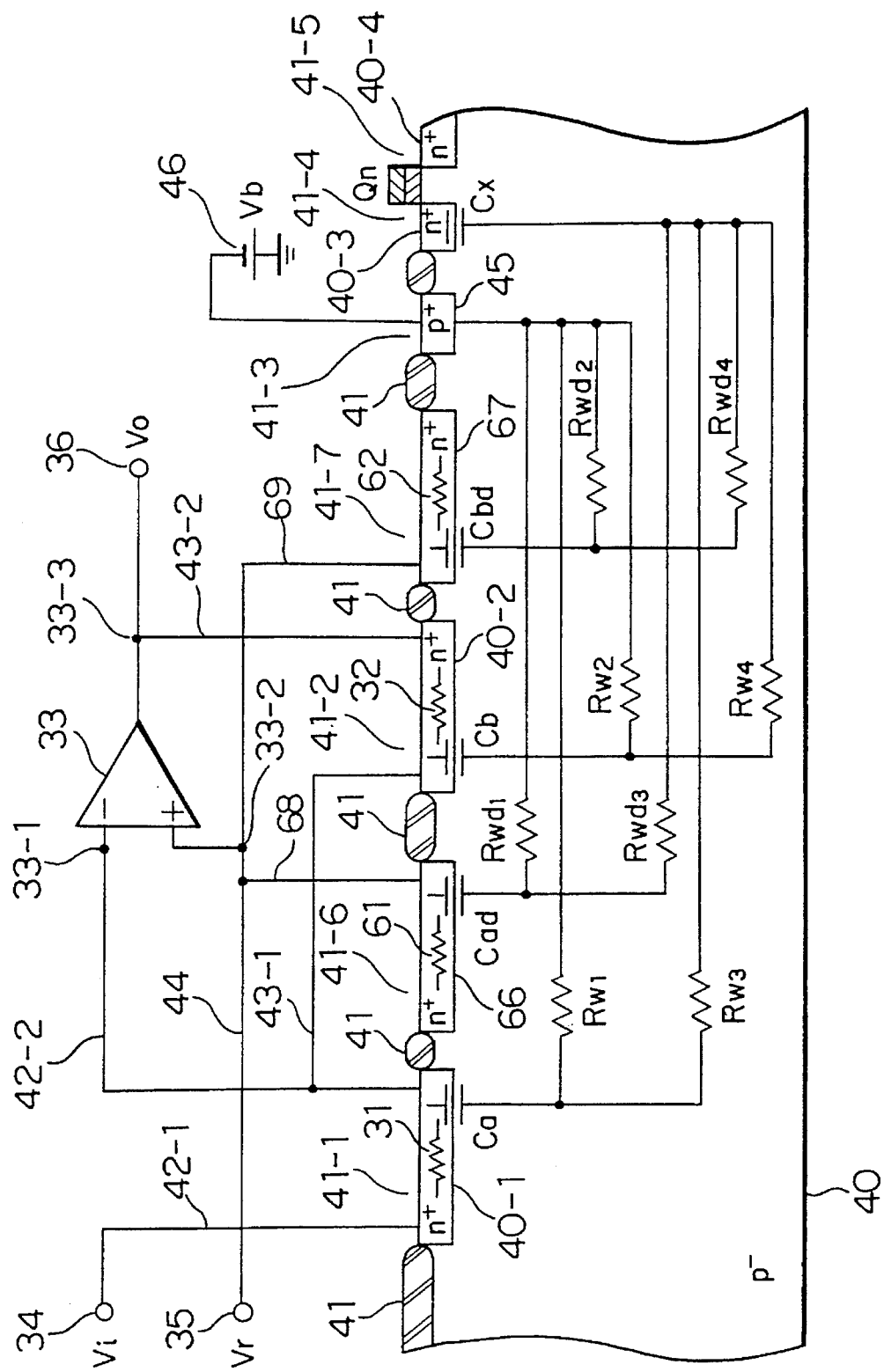
FIG. 13 shows a sectional view of a semiconductor substrate for describing a first manner which is for forming first and second resistors illustrated in FIG. 12.

Referring to FIG. 13, the inverting amplifier circuit is similar to that illustrated in FIG. 5 except that first and second $n^+$ dummy diffusion layers 66 and 67 are formed on the semiconductor substrate 40 through sixth and seventh apertures 41-6 and 41-7 of the field oxide film 41 and that one ends of the first and the second $n^+$ dummy diffusion layers 66 and 67 are connected to the non-inverting terminal 33-2 through aluminum wiring patterns 68 and 69, respectively. Needless to say, the first and the second $n^+$ dummy diffusion layers 66 and 67 serve as the first and the second dummy resistors 61 and 62, respectively. The first and the second dummy parasitic capacitors are symbolically depicted at Cad and Cbd, respectively.

As mentioned in conjunction with FIG. 5, the first $n^+$ diffusion layer 40-1 and the $p^+$ diffusion layer 45 are connected through the first parasitic resistor Rw1 and the first parasitic capacitor Ca while the second $n^+$ diffusion layer 40-2 and the $p^+$ diffusion layer 45 are connected through the second parasitic resistor Rw2 and the second parasitic capacitor Cb. The first $n^+$ diffusion layer 40-1 and the third n diffusion layer 40-3 are connected through the third parasitic resistor Rw3 and the first parasitic capacitor Ca while the second $n^+$ diffusion layer 40-2 and the third $n^+$ diffusion layer 40-3 are connected through the fourth parasitic resistor Rw4 and the second parasitic capacitor Cb.

Likewise, the first $n^+$ dummy diffusion layer 66 and the $p^+$ diffusion layer 45 are connected through a first dummy parasitic resistor Rwd1 and the first dummy parasitic capacitor Cad while the second $n^+$ dummy diffusion layer 67 and the $p^+$ diffusion layer 45 are connected through a second dummy parasitic resistor Rwd2 and the second dummy parasitic capacitor Cbd. The first $n^+$ dummy diffusion layer 66 and the third $n^+$ diffusion layer 40-3 are connected through a third dummy parasitic resistor Rwd3 and the first dummy parasitic capacitor Cad while the second $n^+$ dummy diffusion layer 67 and the third $n^+$ diffusion layer 40-3 are connected through a fourth dummy parasitic resistor Rwd4 and the second dummy parasitic capacitor Cbd.

It should be noted here that the first parasitic capacitor Ca and the first dummy parasitic capacitor Cad are equal to each other in capacitance value and that the first parasitic resistor Rw1 and the first dummy parasitic resistor Rwd1 are approximately equal to each other in resistance value because the first resistor 31 and the first dummy resistor 61 are equivalent to each other. Similarly, the second parasitic capacitor Cb and the second dummy parasitic capacitor Cbd are equal to each other in capacitance value. The second parasitic resistor Rw2 and the second dummy parasitic resistor Rwd2 are approximately equal to each other in resistance value. This applies to the third parasitic resistor Rw3 and the third dummy parasitic resistor Rwd3 and to the fourth parasitic resistor Rw4 and the fourth dummy parasitic resistor Rwd4.

Figure 14:
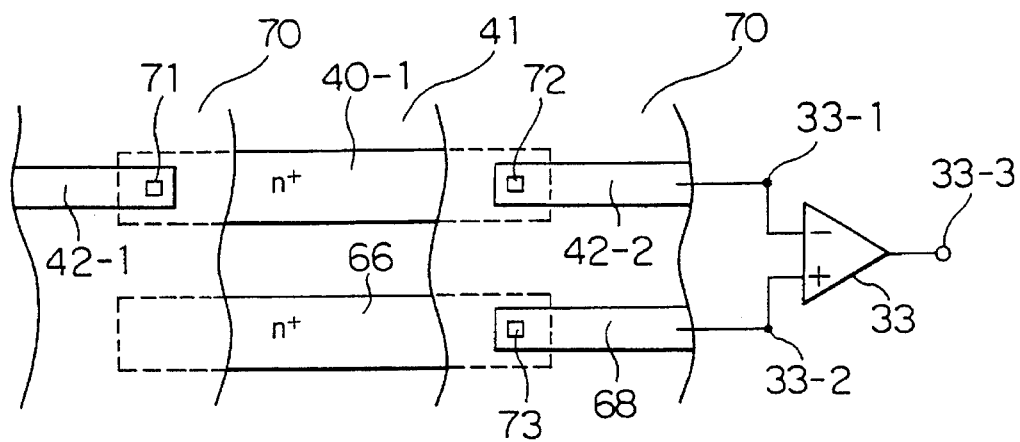
FIG. 14 shows a planar view for describing a connection manner which is for connecting the first and the second resistors illustrated in FIG. 12 and aluminum wiring patterns.

Referring to FIG. 14, the first $n^+$ diffusion layer 40-1 and the first $n^+$ dummy diffusion layer 66 are parallely formed so as to be adjacent to each other. As mentioned before, the first n diffusion layer 40-1 and the first $n^+$ dummy diffusion layer 66 have the same planar form and the same sectional form. One end of the first $n^+$ diffusion layer 40-1 is connected to the signal input terminal 34 (FIG. 12) through the aluminum wiring pattern 42-1 which is partially illustrated. Another end of the first $n^+$ diffusion layer 40-1 is connected to the inverting terminal 33-1 through the aluminum wiring pattern 42-2 which is partially illustrated. One end of the first $n^+$ dummy diffusion layer 66 is connected to the non-inverting terminal 33-2 through the aluminum wiring pattern 68 which is partially illustrated.

In practice, the first $n^+$ diffusion layer 40-1 and the first $n^+$ dummy diffusion layer 66 are covered by an insulator layer 70 together with the field oxide film 41. In this event, both ends of the first $n^+$ diffusion layer 40-1 are connected to aluminum patterns 42-1 and 42-2 through contact holes 71 and 72 formed through the insulator layer 70. Similarly, the first $n^+$ dummy diffusion layer 66 is connected to the aluminum pattern 68 through a contact hole 73 formed through the insulator layer 70. Each of the contact holes 71 to 73 may be called a through hole.

Figure 15:
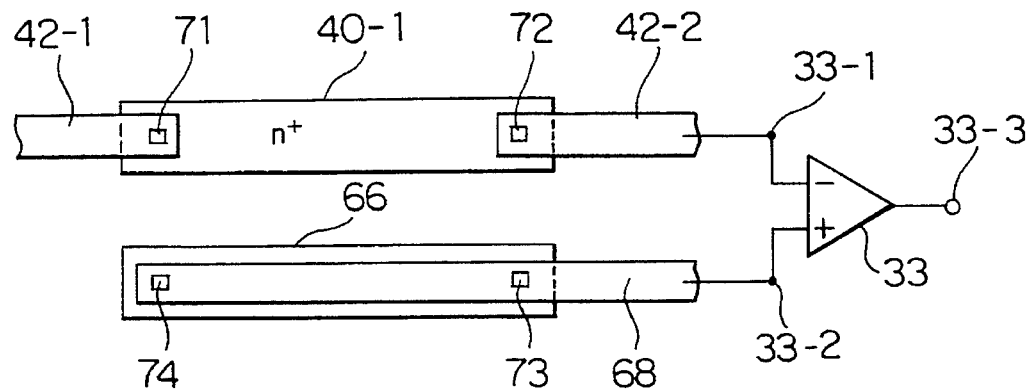
FIG. 15 shows a planar view for describing another connection manner which is for connecting the first and the second resistors and the aluminum wiring patterns.

Referring to FIG. 15, the first $n^+$ diffusion layer 40-1 and the first $n^+$ dummy diffusion layer 66 are parallely formed so as to be adjacent to each other. For convenience, the insulator layer 70 (FIG. 14) is not shown. In the example, the aluminum wiring pattern 68 extends to the other end of the first $n^+$ dummy diffusion layer 66. The first $n^+$ dummy diffusion layer 66 is shortened by the aluminum wiring pattern 68 at both ends thereof through the contact hole 73 and a contact hole 74.

Figure 16:
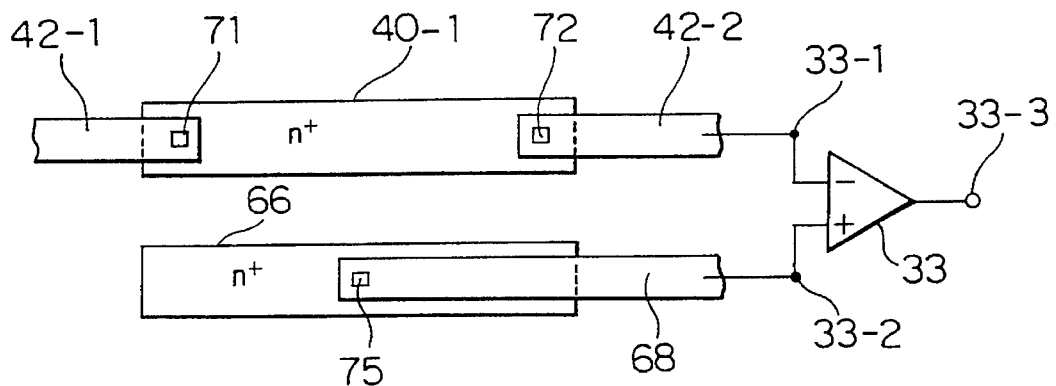
FIG. 16 shows a planar view for describing still another connection manner which is for connecting the first and the second resistors and the aluminum wiring patterns.

Referring to FIG. 16, the first $n^+$ diffusion layer 40-1 and the first $n^+$ dummy diffusion layer 66 are parallely formed so as to be adjacent to each other. The insulator layer 70 (FIG. 14) is not shown. In the example, the aluminum wiring pattern 68 extends to a center portion of the first $n^+$ dummy diffusion layer 66 and is connected to the first $n^+$ dummy diffusion layer 66 at the center portion through a contact hole 75.

Turning back to FIG. 13, the description will be made as regards the case that the outer noise intrudes into the $p^+$ diffusion layer 45. In this case, it causes the variation of the potential of the silicon substrate 40 as mentioned in conjunction with FIG. 5. Such variation of the potential is transmitted to the first $n^+$ diffusion layer 40-1 through the first parasitic resistor Rw1 and the first parasitic capacitor Ca. The variation of the potential is also transmitted to the second $n^+$ diffusion layer 40-2 through the second parasitic resistor Rw2 and the second parasitic capacitor Cb. In this event, it causes the variation of the potential of the inverting terminal 33-1 because the inverting terminal 33-1 is connected to the first and the second $n^+$ diffusion layers 40-1 and 40-2.

On the other hand, the variation of the potential caused by the $p^+$ diffusion layer 45 is transmitted to the first $n^+$ dummy diffusion layer 66 through the first dummy parasitic resistor Rwd1 and the first dummy parasitic capacitor Cad and is transmitted to the second $n^+$ dummy diffusion layer 67 through the second dummy parasitic resistor Rwd2 and the second dummy parasitic capacitor Cbd. In this event, it causes the variation of the potential of the non-inverting terminal 33-2 because the non-inverting terminal 33-2 is connected to the first and the second $n^+$ dummy diffusion layers 66 and 67.

As mentioned before, the first and the second parasitic resistors Rw1 and Rw2 are equal, in resistance value, to those of the first and the second dummy parasitic resistors Rwd1 and Rwd2, respectively. The first and the second parasitic capacitors Ca and Cb are equal, in capacitance value, to those of the first and the second dummy parasitic capacitors Cad and Cbd, respectively. In this case, the inverting and the non-inverting terminals 33-1 and 33-2 have the same variation in amplitude and in timing or phase, even if the outer noise intrudes into the $p^+$ diffusion layer 45. This means that the variation of the output voltage Vo can be reduced by a common-mode rejection ratio, if the silicon substrate 40 has the variation of the potential caused by the outer noise.

If the potential of the third $n^+$ diffusion layer 40-3, namely, the drain electrode, varies with the operation of the MOS transistor Qn, the variation is transmitted to the silicon substrate 40 through the third parasitic capacitor Cx. Such variation of the potential is transmitted to the first $n^+$ diffusion layer 40-1 through the third parasitic resistor Rw3 and the first parasitic capacitor Ca. The variation of the potential is also transmitted to the second $n^+$ diffusion layer 40-2 through the fourth parasitic resistor Rw4 and the second parasitic capacitor Cb. It causes the variation of the potential of the inverting terminal 33-1.

On the other hand, the variation of the potential caused by the third $n^+$ diffusion layer 40-3 is transmitted to the first $n^+$ dummy diffusion layer 66 through the third dummy parasitic resistor Rwd3 and the first dummy parasitic capacitor Cad and is transmitted to the second $n^+$ dummy diffusion layer 67 through the fourth dummy parasitic resistor Rwd4 and the second dummy parasitic capacitor Cbd. In this event, it causes the variation of the potential of the non-inverting terminal 33-2.

As mentioned before, the third and the fourth parasitic resistors Rw3 and Rw4 are equal, in resistance value, to those of the third and the fourth dummy parasitic resistors Rwd3 and Rwd4, respectively. In this case, the inverting and the non-inverting terminals 33-1 and 33-2 have the same variation in amplitude and in phase, even if the silicon substrate 40 has the variation of the potential caused by the third $n^+$ diffusion layer 40-3. As a result, the variation of the output voltage Vo can be reduced by the common-mode rejection ratio, if the silicon substrate 40 has the variation of the potential.

Let the first and the second resistors 31 and 32 have the first and the second resistance values R1 and R2 which are equal to 1 (kΩ) and 100 (kΩ), respectively. The reference voltage Vr and the input voltage Vi are equal to 0 (V) and 10 (mV), respectively. In this state, if the inverting terminal 33-1 has the variation of 1 (mV) caused by the variation of the potential in the silicon substrate 40, the non-inverting terminal 33-2 also has the variation of 1 (mV). If the differential amplifier circuit 33 has the common-mode rejection ratio of 80 (dB), the variation of the output voltage Vo can be reduced by 0.01 (mV). Such variation of the output voltage Vo is extremely lower than that of the conventional inverting amplifier circuit illustrated in FIG. 5.

Although the above description is made as regards the inverting amplifier circuit, this invention can be applied to a non-inverting amplifier circuit. In this event, the signal input terminal 34 is used as a voltage input terminal for receiving an offset voltage of a constant voltage Vc. The reference voltage input terminal 35 is used as a signal input terminal for receiving an input signal having a signal voltage Vs. The output voltage Vo of the output signal is given by:

$$Vo=(1+(R2/R1))Vs-(R2/R1)Vc.$$

At any rate, the non-inverting amplifier circuit can produce the output signal without a degraded S/N caused by the variation of the potential in the semiconductor substrate.

Furthermore, the inverting amplifier circuit may comprise a plurality of resistors, in addition to the first and the second resistors 31 and 32, each of which is similar to the first resistor 31 and each of which serves as a signal input resistor. In this case, a plurality of dummy resistors are formed so as to adjoin the respective resistors in one-to-one correspondence. Such an inverting amplifier circuit can be applied to an adder circuit.

Figure 17:
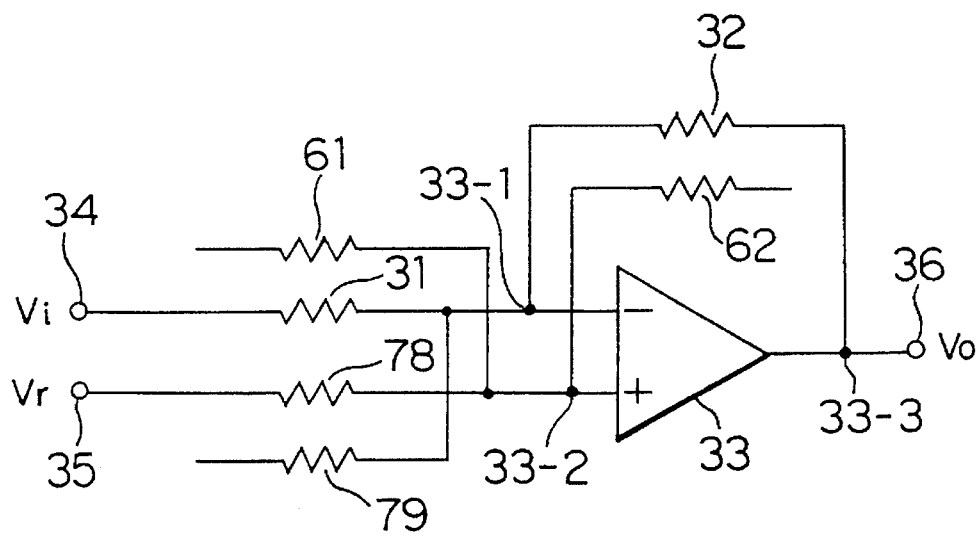
FIG. 17 shows a sectional view of a semiconductor substrate for describing a second manner which is for forming the first and the second resistors illustrated in FIG. 12.

Referring to FIG. 17, the description will be made as regards an analog inverting amplifier circuit. The analog inverting amplifier circuit is similar to that illustrated in FIG. 12 except that a third resistor 78 is connected between the reference voltage input terminal 35 and the non-inverting terminal 33-2 and that a third dummy resistor 79 is formed so as to adjoin the third resistor 78. As well known in the art, the third resistor 78 is for eliminating an offset of input.

Needless to say, the third dummy resistor 79 is similar, in planar form and in sectional form, to the third resistor 78. One end of the third dummy resistor 79 is connected to the inverting terminal 33-1 because the third resistor 78 is connected to the non-inverting terminal 33-2. Another end of the third dummy resistor 79 is opened. For the same reason as mentioned in conjunction with FIG. 13, the analog inverting amplifier circuit can prevent from degradation of S/N caused by the variation of the potential in the semiconductor substrate.

Figure 18:
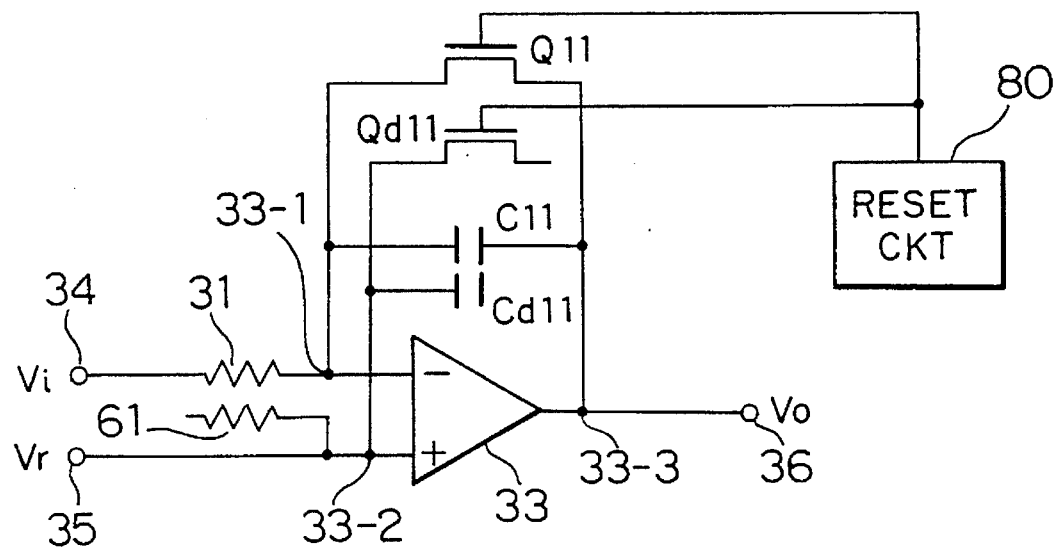
FIG. 18 shows a circuit arrangement of another example of the semiconductor circuit device according to this invention.

Referring to FIG. 18, the description will be made as regards an integrating circuit as another example of the semiconductor circuit device. The integrating circuit comprises similar parts designated by like reference numerals except for an MOS transistor Q11 of the n-channel, a dummy MOS transistor Qd11, a capacitor C11 having a capacitance value C, a dummy capacitor Cd11, and a reset circuit 80.

As mentioned before, the first dummy resistor 61 is formed so as to adjoin the first resistor 31 and is similar, in planar form and in sectional form, to the first resistor 31. Likewise, the dummy MOS transistor Qd11 is formed so as to adjoin the MOS transistor Q11 and is similar, in planar form and in sectional form, to the MOS transistor Q11. The dummy capacitor Cd11 is formed so as to adjoin the capacitor C11 and is similar, in planar form and in sectional form, to the capacitor C11.

The MOS transistor Q11 is for discharging electric charges charged in the capacitor C11 on reset of the integrating circuit. For this purpose, a gate electrode of the MOS transistor Q11 is connected to the reset circuit 80. In other words, the MOS transistor Q11 is put into an on state by the reset circuit 80 when the integrating circuit is reset. In the example, a source electrode of the dummy MOS transistor Qd11 is connected to the non-inverting terminal 33-2 because a source electrode of the MOS transistor Q11 is connected to the inverting terminal 33-1. A drain electrode of the dummy MOS transistor Qd11 is opened. A gate electrode of the dummy MOS transistor Qd11 is connected to the reset circuit 80. Similarly, one end of the dummy capacitor Cd11 is connected to the non-inverting terminal 33-2 because one end of the capacitor C11 is connected to the inverting terminal 33-1. Another end of the dummy capacitor Cd11 is opened.

When the MOS transistor Q11 is put into an off state, the output voltage Vo is given by:

$$Vo=-(1/C\cdot R1)\cdot\int Vidt.$$

Thus, the integrating circuit carries out an integrating operation.

Figure 19:
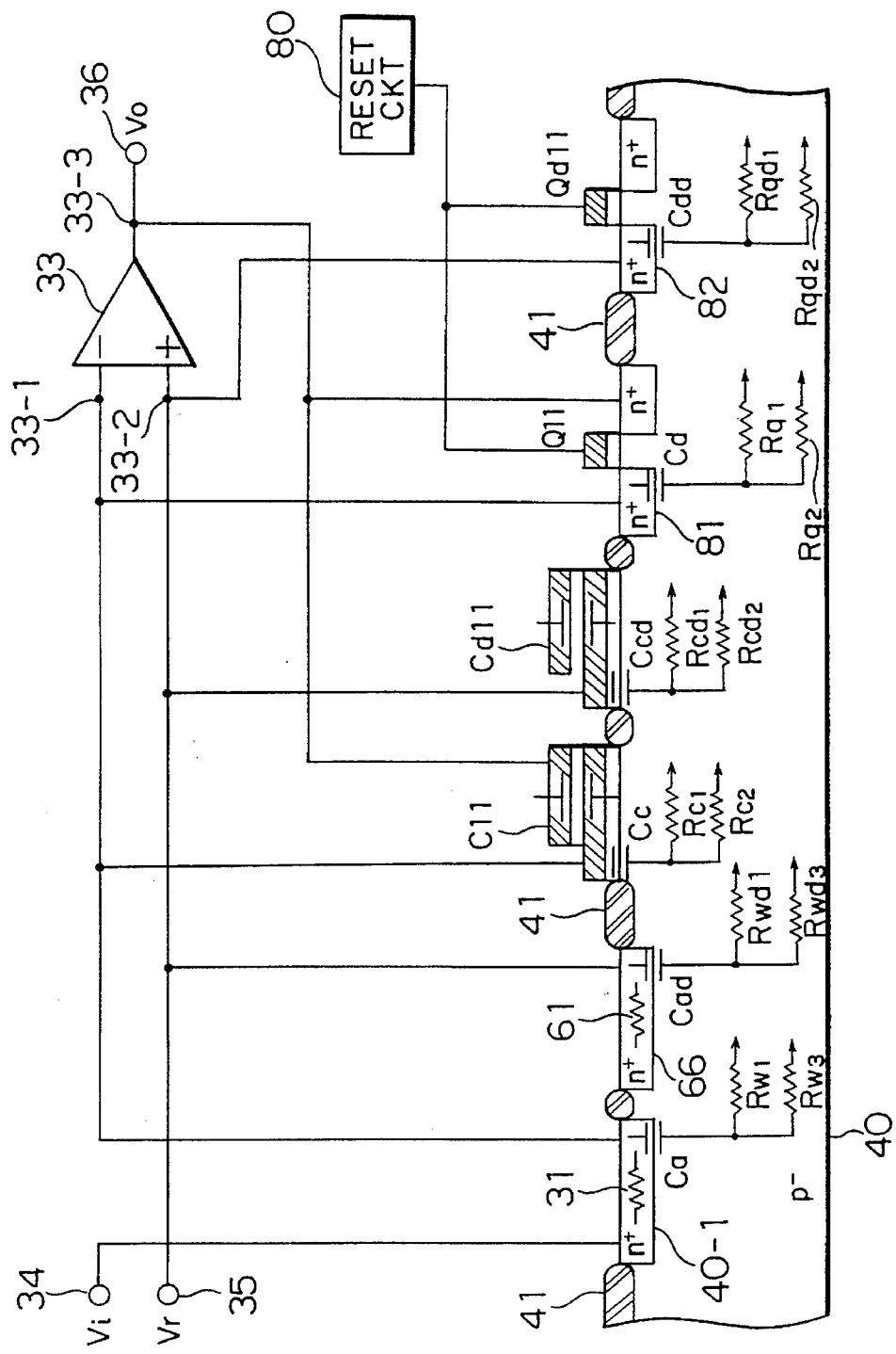
FIG. 19 shows a circuit arrangement of still another example of the semiconductor circuit device according to this invention.

Referring to FIG. 19, the first $n^+$ diffusion layer 40-1 and the first $n^+$ dummy diffusion layer 66 are formed on the silicon substrate 40 so as to be adjacent to each other. The capacitor C11 and the dummy capacitor Cd11 are formed on the silicon substrate 40 so as to be adjacent to each other. Similarly, the MOS transistor Q11 and the dummy MOS transistor Qd11 are formed on the silicon substrate 40 so as to be adjacent to each other. Although not depicted in FIG. 19, it will be assumed that the $p^+$ diffusion layer 45 (FIG. 13) and the MOS transistor Qn (FIG. 13) are formed on the silicon substrate 40.

The first parasitic capacitor Ca is formed between the first $n^+$ diffusion layer 40-1 and the silicon substrate 40 while the first dummy parasitic capacitor Cad is formed between the first $n^+$ dummy diffusion layer 66 and the silicon substrate 40. The first parasitic capacitor Ca and the first dummy parasitic capacitor Cad are equal, in capacitance value, to each other. A third parasitic capacitor Cc is formed between the capacitor C11 and the silicon substrate 40 while a third dummy parasitic capacitor Ccd is formed between the dummy capacitor Cd11 and the silicon substrate 40. The third parasitic capacitor Cc and the third dummy parasitic capacitor Ccd are equal, in capacitance value, to each other. Likewise, a fourth parasitic capacitor Cd is formed between a source layer 81 of the MOS transistor Q11 and the silicon substrate 40 while a fourth dummy parasitic capacitor Cdd is formed between a dummy source layer 82 of the dummy MOS transistor Qd11 and the silicon substrate 40. The fourth parasitic capacitor Cd and the fourth dummy parasitic capacitor Cdd are equal, in capacitance value, to each other. Each of the source and the dummy source layers 81 and 82 are implemented by the $n^+$ diffusion layer.

As mentioned in conjunction with FIG. 13, the first $n^+$ diffusion layer 40-1 is connected to the $p^+$ diffusion layer 45 (FIG. 13) through the first parasitic resistor Rw1 and the first parasitic capacitor Ca and is connected to the third $n^+$ diffusion layer 40-3 of the MOS transistor Qn (FIG. 13) through the third parasitic resistor Rw3 and the first parasitic capacitor Ca. The first $n^+$ dummy diffusion layer 66 is connected to the $p^+$ diffusion layer 45 through the first dummy parasitic resistor Rwd1 and the first dummy parasitic capacitor Cad and is connected to the third $n^+$ diffusion layer 40-3 through the third dummy parasitic resistor Rwd3 and the first dummy parasitic capacitor Cad. This applies to each of the capacitor C11, the dummy capacitor Cd11, the MOS transistor Q11, and the dummy MOS transistor Qd11.

For example, the capacitor C11 is connected to the $p^+$ diffusion layer 45 through a parasitic resistor Rc1 and the third parasitic capacitor Cc and is connected to the third $n^+$ diffusion layer 40-3 of the MOS transistor Qn through a parasitic resistor Rc2 and the third parasitic capacitor Cc.

If the silicon substrate 40 has the variation of the potential caused by the $p^+$ diffusion layer 45 for the reason mentioned in conjunction with FIG. 13, the variation of the potential is transmitted to the first $n^+$ diffusion layer 40-1 through the first parasitic resistor Rw1 and the first parasitic capacitor Ca. The variation is also transmitted to the capacitor C11 through the parasitic resistor Rc1 and the third parasitic capacitor Cc. The variation is further transmitted to the source layer 81 through a parasitic resistor Rq1 and the fourth parasitic capacitor Cd. These variations cause the variation of the potential in the inverting terminal 33-1.

On the other hand, the variation of the potential caused by the $p^+$ diffusion layer 45 is transmitted to the first $n^+$ dummy diffusion layer 66 through the first dummy parasitic resistor Rwd1 and the first dummy parasitic capacitor Cad. The variation is also transmitted to the dummy capacitor Cd11 through the dummy parasitic resistor Rcd1 and the third dummy parasitic capacitor Ccd. The variation is further transmitted to the dummy source layer 82 through a dummy parasitic resistor Rqd1 and the fourth dummy parasitic capacitor Cdd. These variations cause the variation of the potential in the non-inverting terminal 33-2. The variation of the potential in the non-inverting terminal 33-2 is equal, in amplitude and in phase, to that of the inverting terminal 33-1 for the same reason as mentioned in conjunction with FIG. 13. This means that the variation of the output voltage Vo can be reduced by the common-mode rejection ratio, if the silicon substrate 40 has the variation of the potential caused by the outer noise.

This applies to the case that the potential of the third $n^+$ diffusion layer 40-3 (FIG. 13) varies with the operation of the MOS transistor Qn (FIG. 13). In this case, the third parasitic resistor Rw3, the third dummy parasitic resistor Rwd3, parasitic resistors Rc2 and Rq2, and dummy parasitic resistors Rcd2 and Rqd2 are used in place of the first parasitic resistor Rw1, the first dummy parasitic resistor Rwd1, the parasitic resistors Rc1 and Rq1, and the dummy parasitic resistors Rcd1 and Rqd1.

While this invention has thus far been described in conjunction with few embodiments thereof, it will readily be possible for those skilled in the art to put this invention into practice in various other manners.

What is claimed is:

1. A semiconductor circuit device comprising a semiconductor substrate, a differential amplifier circuit which is formed on said semiconductor substrate and which comprises first and second input terminals, and a circuit element formed on said semiconductor substrate and connected to one of said first and said second input terminals, said semiconductor circuit device having a first parasitic capacitor formed between said circuit element and said semiconductor substrate, wherein:

said semiconductor circuit device further comprises a dummy circuit element formed on said semiconductor substrate so as to adjoin said circuit element for forming between said dummy circuit element and said semiconductor substrate a second parasitic capacitor which is equivalent to said first parasitic capacitor, said dummy circuit element being connected to another one of said first and said second input terminals.

2. A semiconductor circuit device as claimed in claim 1, wherein said circuit element has a predetermined sectional form and a predetermined planar form, said dummy circuit element having a prescribed sectional form and a prescribed planar form which are similar to said predetermined sectional form and said predetermined planar form, respectively.

3. A semiconductor circuit device as claimed in claim 1, wherein said circuit element is one of a resistor, capacitor, and a transistor.

4. A semiconductor circuit element as claimed in claim 3, said circuit device being said resistor, wherein said resistor is implemented by a diffusion layer.

5. A semiconductor circuit device as claimed in claim 2, wherein said circuit element comprises one of a resistor, capacitor, and a transistor.

6. A semiconductor circuit device as claimed in claim 5, said circuit element being said resistor, wherein said resistor is implemented by a diffusion layer.

* * * * *